United States Patent

Klein et al.

[15] 3,673,471

[45] June 27, 1972

[54] DOPED SEMICONDUCTOR ELECTRODES FOR MOS TYPE DEVICES

[72] Inventors: Thomas Klein, Palo Alto; Federico Faggin, Cupertino, both of Calif.

[73] Assignee: Fairchild Camera and Instrument Corporation, Mountain View, Calif.

[22] Filed: Oct. 8, 1970

[21] Appl. No.: 70,978

[52] U.S. Cl. ..................317/235 R, 317/235 B, 317/235 AT, 29/571, 148/175

[51] Int. Cl. ..........................................................H01l 11/14

[58] Field of Search................................................317/225 B

[56] References Cited

UNITED STATES PATENTS

| | | | |
|---|---|---|---|
| 3,355,637 | 11/1967 | Johnson | 317/235 |
| 3,386,016 | 5/1968 | Lindmayer | 317/235 |
| 3,460,007 | 8/1969 | Scott | 317/235 |
| 3,514,676 | 5/1970 | Fa | 317/235 |
| 3,519,901 | 7/1970 | Bean et al. | 317/235 |
| 3,576,478 | 4/1971 | Watkins et al. | 317/235 |

*Primary Examiner*—Jerry D. Craig

*Attorney*—Roger S. Borovoy and Alan H. MacPherson

[57] ABSTRACT

The threshold voltage required to invert an MOS device is both shifted and selectively controlled by using appropriately doped semiconductor material as the gate electrode.

1 Claim, 29 Drawing Figures

INVENTORS
THOMAS KLEIN
FREDERICO FAGGIN
BY Roger L. Borovoy
Alan H. MacPherson
ATTORNEYS

INVENTORS
THOMAS KLEIN
FREDERICO FAGGIN
BY
ATTORNEYS

INVENTORS
THOMAS KLEIN
FREDERICO FAGGIN

BY
ATTORNEYS

INVENTORS
THOMAS KLEIN
FREDERICO FAGGIN

BY Roger L. Borovoy
Alan H. MacPherson
ATTORNEYS

INVENTORS
THOMAS KLEIN
FREDERICO FAGGIN

BY

ATTORNEYS

DOPED SEMICONDUCTOR ELECTRODES FOR MOS TYPE DEVICES

This application is a continuation of Ser. No. 784,144 filed Dec. 16, 1968, now abandoned.

BACKGROUND OF THE INVENTION

1. Field of the Invention

This invention relates to MOS devices and in particular to MOS devices using appropriately doped semiconductor material as the gate electrode.

2. Description of the Prior Art

An MOS device, where the letters "MOS" stand for metal-oxide-semiconductor, is essentially a voltage-controlled resistor or "channel region" linking two electrically-separated, highly conductive source and drain regions of a first conductivity type diffused into an opposite conductivity type substrate of semiconductor material. The channel region is formed by applying a selected voltage to a metal gate electrode overlying but insulated from the substrate so as to invert the conductivity type of the underlying region of the substrate. By varying the voltage applied to the gate electrode after inversion, the number of mobile carriers (i.e. electrons or holes) in this channel region, and thus the conductivity of this channel, are varied.

MOS devices are commonly used as either capacitors or transistors. When used as a capacitor, charge stored in the gate electrode is matched by an equal charge of opposite polarity stored in the substrate beneath the gate electrode. When used as a transistor, the current flow between source and drain is controlled by controlling both the bias voltages applied to the source and drain, and the voltage applied to the gate electrode overlying the channel region.

There are two types of MOS transistors, an "enhancement mode" transistor, the channel region of which, though normally not conducting, inverts and increases in conductivity in response to an applied gate voltage, and, a "depletion mode" transistor, the channel region of which, though normally conducting, may increase or decrease its conductivity in response to an applied gate voltage.

An enhancement mode P channel MOS transistor contains N-type semiconductor materials between P-type source and drain regions. Application of a selected negative voltage to the gate electrode overlying but insulated from the channel region inverts the semiconductor material in the channel from N-type to P-type. Thus, the conductivity of this channel region changes from a low to a high value resulting in a controlled flow of current from the P-type source region to the P-type drain region.

In the P type depletion mode transistor, the channel region is normally conducting. Application of a positive voltage to the metal electrode overlying but insulated from the channel region depletes the positive mobile carriers from the channel region underlying the gate electrode with the result that this region becomes N-type. P-N junctions will then isolate the source and drain regions resulting in very high resistance between these regions.

In the operation of an MOS transistor, the voltage applied to the metal gate electrode must exceed a threshold voltage to obtain inversion of the channel region beneath the gate electrode. This so-called "turn-on voltage," commonly denoted by the symbol $V_T$, depends, among other variables, on the "work function" difference $\Phi_{MS}$ between the metal used in the gate electrode and the semiconductor material, on the surface charge $Q_{ss}$ trapped in the insulation between the gate electrode and the underlying channel region, and on the thickness and dielectric constant of this insulation. (The work function is defined as the energy required to remove an electron from the Fermi level in a given material to vacuum. The Fermi level, in turn, is that energy level in a material which has a 50 percent probability of occupation by an electron.) Consequently, until now, to change the turn-on voltage of an MOS device one has had several choices. First the materials used for the gate electrode or the semiconductor substrate could be changed. Alternatively, the method used to grow the thermal oxide, which affects $Q_{ss}$, could be varied. Finally, the thickness and/or the type of insulation could be changed. Of these techniques, the last-changing the thickness of the insulation—is most often employed. Typically, the insulation beneath the gate electrode is made thinner by a factor of 10 than the insulation beneath the deposited lead to the gate electrode. This allows sufficient voltage to be applied to the gate electrode to invert the channel region beneath this gate electrode without at the same time inverting portions of the semiconductor substrate beneath the lead to this electrode. Unfortunately, insulation thickness is not always accurately controlled. As a result, a voltage applied to a gate electrode sometimes inverts not only the selected semiconductor material beneath this electrode, but also semiconductor material beneath the lead to the electrode. This changes the characteristics and performance of the circuit containing the MOS device.

A measure of the likelihood of inverting the semiconductor material beneath this lead is the ratio of turn-on voltage $V_{TL}$ for the semiconductor material beneath the gate electrode lead to the turn-on voltage $V_{TG}$ for the semiconductor material beneath the gate itself. When the insulation beneath the lead is one micron (10,000 angstroms) thick, the insulation beneath the gate electrode is 1,000 angstroms thick, the gate electrode is aluminum, and the semiconductor material is silicon, this ratio is about 7. Consequently, a large voltage combined with an unexpectedly thin lead insulation suffices to invert unwanted portions of the semiconductor material.

SUMMARY OF THE INVENTION

According to this invention, on the other hand, the turn-on voltage of an MOS transistor is controlled by using appropriately doped semiconductor material for the gate electrode. This increases the ratio of $V_{TL}$ to $V_{TG}$ from just beneath 7 to over 11, a factor of nearly 70 percent, when the gate insulation is 0.1 micron thick, the lead insulation is 10 times as thick as the gate insulation, and when silicon is used for both the gate electrode and the underlying semiconductor material. Additionally, by changing the impurity concentration in the gate material, the work function difference between the gate electrode and the underlying semiconductor material is varied, thereby varying the transistor's turn-on voltage. The turn-on voltage variations achieved this way cover a selected voltage range near each end of the band gap potential of the semiconductor gate material. For silicon, this range is about 0.2 volt.

In one embodiment of this invention the gate electrode of an MOS device is made of P-type amorphous silicon while the semiconductor material is monocrystalline N-type silicon containing P-type source and drain regions. The impurity concentration of the P-type silicon gate is about $10^{17}$ atoms per cubic centimeter or greater.

In another embodiment of this invention, the gate electrode is made of N-type amorphous silicon while the semiconductor material is N-type monocrystalline silicon containing P-type source and drain regions. The gate impurity concentration is likewise about $10^{17}$ atoms per cubic centimeter or greater.

Interestingly, when the semiconductor gate electrodes of this invention, some doped with N-type impurities and some doped with P-type impurities, are combined to form a single integrated circuit, structures uniquely suited for use as inverters, complementary logic circuits and flip-flops, to name a few, are obtained. In these circuits, the semiconductor substrate beneath each gate electrode is doped with either P-type or N-type impurities depending on the turn-on voltage desired for the channel beneath each silicon gate. Described and shown in detail is a basic complementary MOS inverter using both P and N-type amorphous silicon gate electrodes over a doped monocrystalline silicon substrate.

While the invention is described with doped silicon as the gate electrode, other semiconductor materials can be used in place of silicon. Because the Fermi level of the doped semiconductor gate electrode must be near either of the two limits of the semiconductor band gap potential in order that the semiconductor have sufficiently high conductivity to function as a substantially equipotential gate electrode, the band gap potential of a particular semiconductor material limits the range of turn-on voltage variation obtainable with that material. The band-gap potential of silicon is about 1.1 ev at room temperature. But the band gap potential of gallium arsenide is about 1.4 ev at room temperature while the band gap potential of gallium phosphide is about 2.4 ev at room temperature. Properly combining gallium arsenide and gallium phosphide yields compounds with band-gap potentials extending from 1.4 to 2.4 ev. In addition, silicon carbide has a band-gap potential of 3.0 at room temperature. Thus, by selecting the proper semiconductor material for the gate electrode and properly doping this material, a wide range of turn-on voltages can be achieved.

To implement this invention, processes for making MOS devices with doped semiconductor material as the gate electrode are disclosed. In one process, a thin layer of silicon dioxide is deposited over one face of a wafer of monocrystalline silicon containing impurities of a first type. Then a layer of amorphous silicon is grown over this silicon dioxide and windows are etched through these silicon and silicon dioxide layers to expose the future source and drain regions of the MOS device. Impurities of either a first or a second type are then diffused into the source and drain regions as well as into the overlying layer of amorphous silicon which will serve as the gate electrode. Silicon dioxide is next deposited over the surface of the wafer, covering the source and drain regions and the silicon. Windows etched through this silicon dioxide layer expose portions of the surfaces of the source and drain regions and the doped silicon gate. Aluminum contacts to the underlying source, drain, and silicon are then evaporated over these windows.

The doped silicon gate is separated from a channel region between the source and drain regions by the underlying silicon dioxide. Because the diffused source and drain regions in the monocrystalline silicon extend laterally beneath the silicon dioxide layer as a result of lateral impurity diffusion, the doped silicon gate electrode overlies, and is accurately centered between, the inside edges of the source and drain regions. This accurate alignment of the gate electrode reduces the capacitance at the edges of the gate electrode and thus improves the high frequency performance of the resulting MOS device.

This invention will be more fully understood in light of the following detailed description taken together with the accompanying drawings.

DETAILED DESCRIPTION OF THE PREFERRED EMBODIMENTS

Figure 1A:
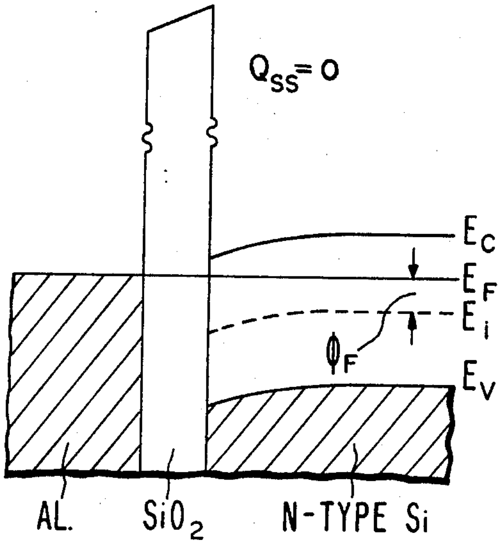
FIGS. 1*a* and 1*b* show the potential distribution in an aluminum-silicon dioxide-silicon structure for the two cases where the gate voltage $V_G$ is zero and where the gate voltage equals the work function difference $\Phi_{MS}$ between the metal gate electrode and the silicon semiconductor body.
Figure 1B:
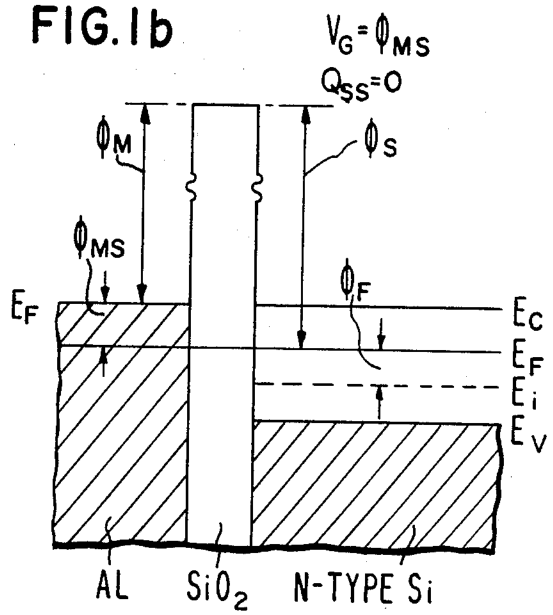

FIGS. 1*a* and 1*b* show the potential distribution, in terms of electron energy, in an aluminum-silicon dioxide-silicon MOS structure of the prior art when the gate voltage applied to the aluminum is zero. The abscissa represents various positions along a cross section through the multi-layered structure. The aluminum gate is represented on the left, the silicon dioxide insulation in the middle, and the N-type monocrystalline silicon on the right. The three layers of material are in equilibrium and thus the Fermi energy level, shown by the straight line labeled $E_F$ in FIG. 1*a*, is uniform throughout this structure. Aluminum, being a conductor, is at substantially uniform potential throughout and its electrons are very easily removed from their valence bonds. In fact, as is well known, the conduction and valence energy bands of aluminum overlap. Thus the shaded area to the left of the silicon dioxide represents the uniform potential of the aluminum electrons as a function of distance from the silicon dioxide. The silicon dioxide, being an insulator, contains electrons which require much greater amounts of energy to be removed from the valence energy band to the conduction energy band than do similar aluminum electrons. This difference in energies is represented by showing the conduction energy band $E_c$ of the silicon dioxide to be much greater than the conduction energy band $E_c$ of either the aluminum or the doped monocrystalline silicon.

As shown in FIG. 1*a*, when materials with electrons at different electron energy levels are brought together, the normal potential distributions. in these materials shift as the result of the flow of electrons from one material to the other. This inter-material flow of electrons stops when the diffusion and field forces on these electrons balance out to zero. Thus, when aluminum, silicon dioxide, and single crystal silicon are brought together as shown in FIG. 1*a*, electrons group in a region of the silicon adjacent the silicon dioxide-silicon interface. As a result of this grouping, the distribution of electrons in each energy band of the silicon is nonuniform with distance and the energy bands bend downward, as shown, as the silicon-silicon dioxide interface is approached from the silicon. When equilibrium is reached, the Fermi energy level $E_F$ is uniform across the structure.

Upon applying the correct negative voltage to the aluminum, the silicon energy bands straighten, as shown in FIG. 1*b*, to yield the so-called "flat-band condition," a condition in which no charge is induced in the silicon semiconductor material. This phenomenon is discussed by A. S. Grove in Chapter 9 of his book "Physics and Technology of Semiconductor Devices" published 1967 by John Wiley & Sons.

The flat-band condition occurs when the gate voltage $V_g$ equals the barrier voltage difference between the metal and the semiconductor material; that is, when $V_g = \Phi_{MS}$ where $\Phi_{MS} = \Phi_M - \Phi_S$, for zero surface charge $Q_{ss}$. $\Phi_M$ is the metal barrier voltage while $\Phi_S$ is the semiconductor barrier voltage. These barrier energies are defined and described by Grove on pp. 345 and 346 of his above-cited book. The increase in negative voltage on the aluminum gate electrode drives the electrons in the silicon region adjacent the silicon dioxide-silicon interface away from this interface, thereby straightening the valence, conduction and intrinsic energy bands of the silicon. As the gate voltage is made more negative, the electrons in this region next to the interface are further depleted and, if the gate voltage is made sufficiently more negative, the region just beneath this interface inverts, that is, changes from N-type silicon to P-type silicon. This occurs when the intrinsic energy band $E_i$ crosses the Fermi energy band $E_F$ At this point the probability of an electron in the conduction energy band becomes less than the same probability in intrinsic silicon while the probability of a hole in the valence energy band becomes greater than this probability in intrinsic silicon.

Figure 2A:
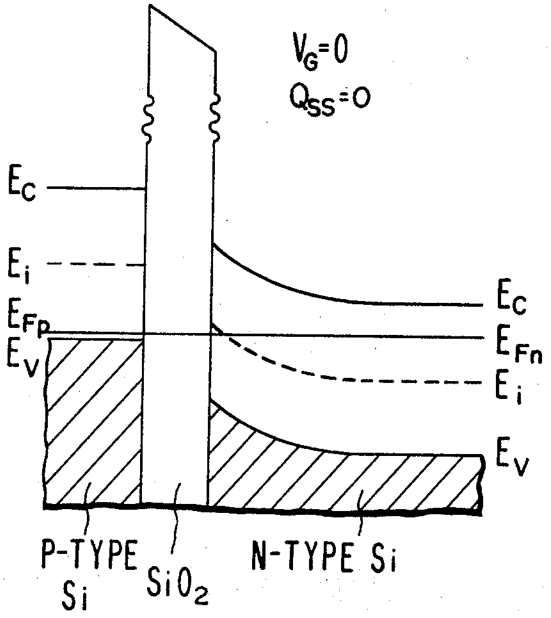
FIGS. 2*a*, 2*b* and 2*c* show the potential distribution in a silicon-silicon dioxide-silicon structure when the gate electrode voltage $V_G$ is zero for two different silicon dioxide thicknesses between the silicon gate electrode and the underlying silicon substrate, and when the gate electrode voltage equals the work function difference $\Phi_{SS}$ between the silicon gate and the silicon-semiconductor material.
Figure 2B:
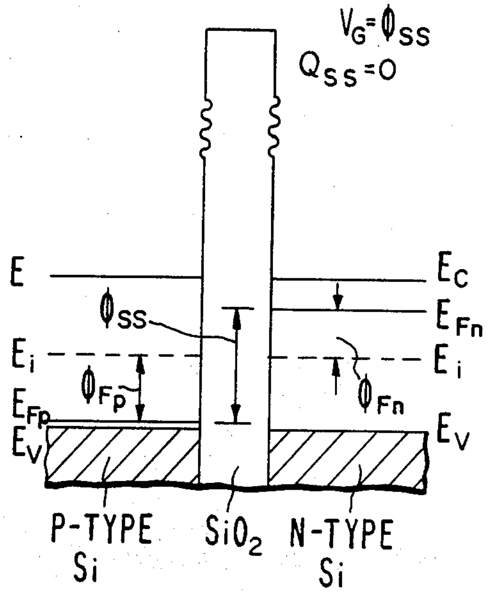
Figure 4A:
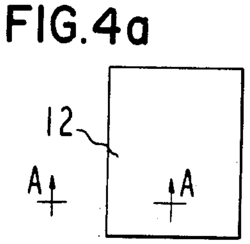
FIGS. 4*a* through 4*d* give top views during various stages of construction of the MOS device shown in FIGS. 3*a* through 3*e*.
Figure 4B:
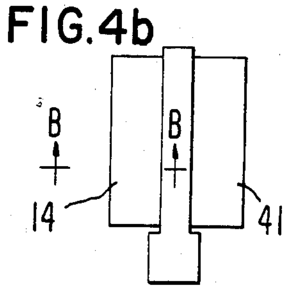
Figure 2C:
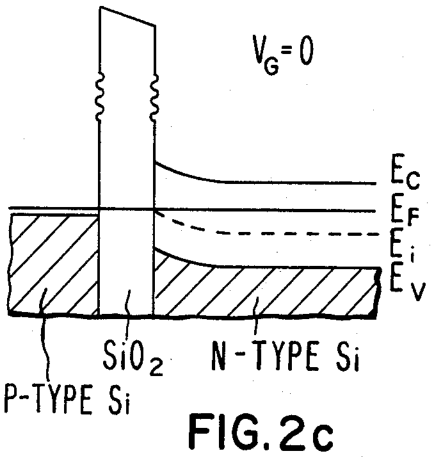

FIGS. 2a, 2b and 2c show the potential distribution across an MOS device containing P-type amorphous silicon as the gate electrode. Hereafter, it should be understood that the silicon used as a gate electrode is amorphous silicon, even though not explicitly stated, unless of course, another type of silicon is explicitly required. The potential distribution through the P-type silicon is approximately uniform because the P-type silicon has been highly doped with acceptor impurities to a concentration of $10^{17}$ to $10^{18}$ atoms per cubic centimeter. Thus the resistivity of this silicon is quite low, typically being less than 0.3 ohm-centimeter. As a result of the use of P-type silicon for the gate electrode, electrons from the N-type silicon are repelled away from the interface of the silicon dioxide and the N-type silicon, as shown in FIG. 2a. This occurs because the Fermi level in all three materials must be uniform when the materials are in equilibrium. For this to occur, the energy bands in the N-type silicon must bend upward as one approaches the silicon-silicon dioxide interface from the silicon. When the intrinsic energy band $E_i$ crosses the Fermi energy level $E_F$ as shown in FIG. 2a, the region of this N-type silicon adjacent the silicon dioxide-silicon interface inverts to P-type silicon. The thickness of the silicon dioxide in FIG. 2a is about 500 angstroms.

FIG. 2c shows the energy band configuration when the silicon dioxide is 700 to 800 angstroms thick. The intrinsic energy band $E_i$ of the N-type single crystal silicon is just beneath the Fermi energy level $E_f$. In this situation the surface of the N-type silicon, though close to inversion, has not inverted. When a negative voltage is applied to the P-type silicon gate, electrons are driven from the silicon-silicon dioxide interface and holes are attracted to this interface. As shown by the closeness of $E_i$ to $E_F$ at the silicon surface, only a small negative voltage is required to invert the region of silicon adjacent the silicon-silicon dioxide interface. As a result, the turn-on voltage of the P-channel MOS device is significantly decreased relative to the turn-on voltage of a typical MOS device with an aluminum gate.

Figure 9:
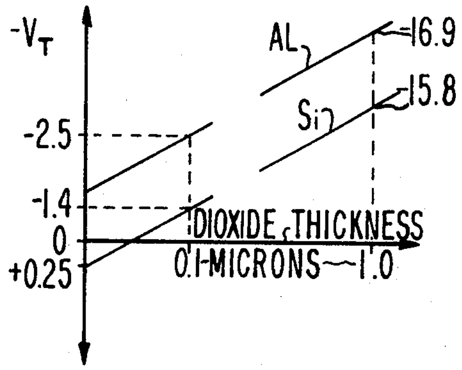
FIG. 9 demonstrates the improvement obtained in the ratio $V_{TL}/V_{TG}$ using a silicon gate electrode with a silicon substrate relative to an aluminum gate electrode with a silicon substrate.

FIG. 9 compares the variation in turn-on voltage between an aluminum gate electrode and a P-type amorphous silicon gate electrode with 1,000 angstrom thick insulation beneath the gate electrode and 10,000 angstrom thick insulation beneath the gate electrode lead. The underlying substrate is N-type monocrystalline silicon, (111) orientation. For a P-type silicon gate, the turn-on voltage $V_{TG}$ is −1.4 volts while the lead turn-on voltage (linearly proportional to oxide thickness) is about −15.8 volts. Thus the ratio $V_{TL}/V_{TG}$ is greater than 11. For an aluminum gate, $V_{TG}$ is −2.5 volts, $V_{TL}$ is −16.9 volts, and $V_{TL}/V_{TG}$ is less than 7. Thus the P-type silicon gate with an N-type substrate gives greater protection against unwanted inversion layers in the silicon substrate than the aluminum gate electrode.

When a positive gate voltage is applied to the P-type silicon gate, as shown in FIG. 2b, electrons are attracted to this interface from the N-type silicon. As a result, the valence, conduction and intrinsic bands of the N-type silicon flatten out.

Figure 6:
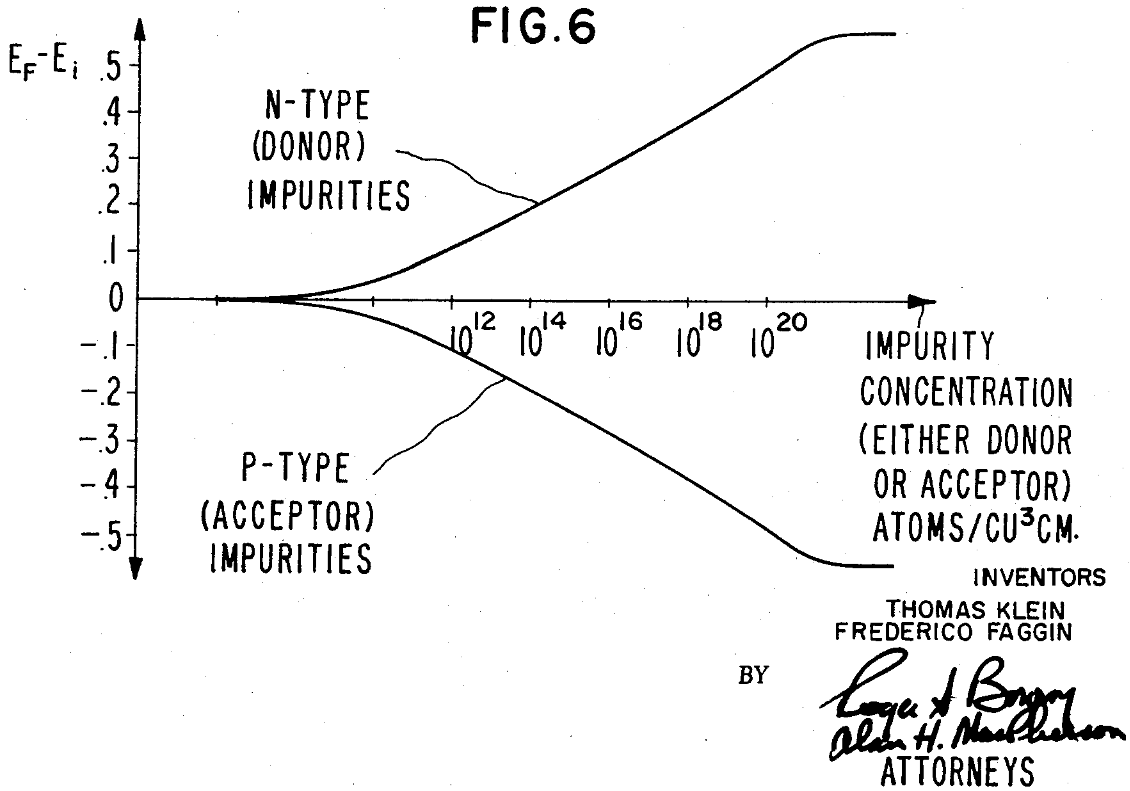
FIG. 6 plots the Fermi level $E_F$ minus the intrinsic Fermi level $E_i$ versus impurity concentration for both donor and acceptor impurities in the silicon gate.

Because the work function of the P-type silicon gate can be varied about 0.2 ev as a function of impurity doping concentration without losing the high conductivity essential to an electrode, the gate voltage needed to invert the surface region of the N-type silicon can be varied a like amount by varying the doping of the silicon gate. This variation of silicon work function with doping, expressed as a shift in Fermi energy level $E_F$ relative to the intrinsic Fermi level $E_i$ for both P and N-type impurities, is shown in FIG. 6. The ordinate of FIG. 6 is $E_F - E_i$, in electron volts. The abscissa is the silicon impurity concentration, in atoms per cubic centimeter, on a logarithmic scale. These curves are calculated from the equation $$E_F - E_i = kTln\frac{[N_D - N_A + \sqrt{(N_D - N_A)^2 + 4n_i^2}]}{2n_i} \quad (1)$$

when donor impurity predominates, or from $$E_i - E_F = kTln\frac{[N_A - N_D + \sqrt{(N_A - N_D)^2 + 4n_i^2}]}{2n_i} \quad (2)$$

when acceptor impurity predominates. In these equations, $E_F$ and $E_i$ have been previously defined, $k$ is Boltzmann's constant, $T$ is temperature in degrees Kelvin, $N_D$ and $N_A$ are the silicon donor and acceptor impurity concentrations in atoms per cubic centimeter, respectively and $n_i$ is the intrinsic carrier concentration of the silicon, also in atoms per cubic centimeter.

When the impurity concentration, either donor or acceptor, is less than $10^{10}$ atoms per cubic centimeter, the silicon crystal behaves much like intrinsic silicon and the Fermi level $E_F$ of the silicon is approximately the intrinsic Fermi level $E_i$ of the silicon.

As the impurity concentration increases, the Fermi level $E_F$ deviates logarithmically from the intrinsic Fermi level $E_i$. For donor impurities, the Fermi level rises relative to the intrinsic Fermi level; for acceptor impurities, the Fermi level falls relative to the intrinsic Fermi level. A maximum shift in Fermi level of about ± 0.55 electron volts from the intrinsic energy level occurs as the doping concentration approaches $10^{19}$ atoms per cubic centimeter. Above this doping, the silicon becomes degenerate and the equations used to calculate FIG. 6 are no longer valid.

Only an acceptor or donor impurity concentration greater than about $10^{17}$ atoms per cubic centimeter gives silicon a high enough conductivity to allow silicon to be used as a gate electrode in an MOS device. In varying the impurity concentration in the silicon from $10^{17}$ to about $10^{19}$ atoms per cubic centimeter, $E_F - E_i$ varies from about 0.35 ev to about 0.55 ev for N-type impurities and from about −0.35 ev to about −0.55 ev for P-type impurities. The resistivities associated with this range of impurity concentrations vary from about 0.3 ohm-centimeters to about 0.01 ohm-centimeters. Interestingly, the silicon resistivities associated with N-type impurities are about half or less the silicon resistivities associated with P-type impurities.

As discussed by Grove in ch. 9 of his book, the turn-on voltage $V_T$ of an MOS device is a function of the surface state charge $Q_{ss}$ in the silicon dioxide at the interface between the silicon dioxide and the underlying silicon substrate, the total charge $Q_B$ in the depletion region at the onset of strong inversion, the capacitance $C_o$ of the insulation between the gate electrode and the substrate, the work function difference $\Phi_{MS}$, or $\Phi_{SS}$ for a silicon gate electrode, between the metal or semiconductor gate electrode and the underlying silicon substrate, and the semiconductor surface potential $2\phi_F$ at the onset of strong inversion, where $\phi_F = E_F - E_i$. Thus $$V_T = -\frac{Q_{ss}}{C_o} + \Phi_{MS} + 2\phi_F - \frac{Q_B}{C_o} \quad (3)$$

$C_o$ is the nominal capacitance per unit area of the silicon dioxide layer and is inversely proportional to the silicon dioxide thickness. In a P-type substrate doped to an impurity concentration of about $10^{15}$ atoms per cubic centimeter, the effects of $Q_B$ and $Q_{ss}$ on $V_T$ cancel; in an N-type substrate with the same impurity concentration these effects add.

The causes of surface state charge $Q_{ss}$ are not at this time fully understood. However, the parameters of silicon-silicon dioxide processing which affect $Q_{ss}$ are discussed by Deal, Sklar, Snow and Grove in a paper entitled "Characteristics of the Surface State Charge ($Q_{ss}$) of Thermally Oxidized Silicon" published in Mar. 1967 on pp. 266 to 274 of the Journal of the Electrochemical Society. The charge $Q_B$, on the other hand, is a function of substrate doping. For N channel enhancement mode devices a $Q_B$ of 4 or 5 $\times$ $10^{11}$ electron charges per cubic centimeter is typical; for P channel devices a $Q_B$ of 0.8 to 2.5 $\times$ $10^{11}$ electron charges per cubic centimeter is likely.

Table I shows the relationship of turn-on voltage $V_T$ to work-function difference $\Phi_{ss}$ between a doped amorphous silicon gate and an underlying monocrystalline silicon substrate for a 1,000 angstrom silicon dioxide insulation separating the silicon gate and substrate. The turn-on voltage $V_T$ is given for two monocrystalline silicon substrate orientations, the (111) and the (100) orientations.

TABLE I

| Silicon substrate | | Silicon Gate | | | $V_T$* | |
|---|---|---|---|---|---|---|
| Impurity type | Impurity concentration | Impurity type | Impurity concentration | $\Phi_{ss}$ | Substrate (111) orientation | Substrate (100) orientation |
| P | $10^{15}$ | P | $10^{19}$ | +0.25 | +0.05 | +0.85 |
| P | $10^{15}$ | N | $10^{19}$ | −0.85 | −1.05 | −0.25 |
| N | $10^{15}$ | P | $10^{19}$ | +0.85 | −1.35 | −0.55 |
| N | $10^{15}$ | N | $10^{19}$ | −0.25 | −2.45 | −1.65 |

*$Q_{ss}=3\times10^{11}$ atoms/cc. for (111) and $10^{11}$ atoms/cc. for (100). $Q_B=10^{11}$ atoms/cc. for both (111) and (100).

FIGS. *3a* through *3e* and *4a* through *4d* show one method by which the semiconductor device of this invention is produced. A substrate 11 of N-type monocrystalline silicon, cut in the (111) plane and with a resistivity somewhere between 5 and 8 ohm-centimeters, has grown on it a layer 12 of silicon dioxide. Layer 12 typically is thermally grown to a thickness of 1 micron in region *a* and to a thickness of 0.1 micron in region *b*. Hereafter silicon 11, together with any overlying layers of metal and/or insulation, will be called wafer 10. FIG. *4a* shows a top view of wafer 10 with the silicon dioxide layer 12 deposited thereon. The portion of wafer 10 from which the cross sectional view A—A shown in FIG. *3a* is derived is clearly marked in FIG. *4a*.

Next, as shown in FIG. *3b*, a layer 13 of amorphous silicon is grown over selected portions of layer 12 of silicon dioxide. Typically, silicon layer 13 is grown to a thickness of 0.5 microns by thermally decomposing silane into silicon and hydrogen in a hydrogen atmosphere held between 630° and 680° C.

Extreme care is taken in cleaning the surface of silicon dioxide layer 12 before growing amorphous silicon 13 because foreign particles on this surface cause nucleation centers and whisker patterns to appear in the amorphous silicon. To clean the surface of layer 12, wafer 10 is dipped for 10 seconds into a 10 to 1 hydrofluoric rinse at room temperature. Then wafer 10 is subjected for over 5 minutes to a de-ionized water spray rinse. While 5 minutes are adequate to clean the surface of layer 12, 15 minutes are typically used to provide a margin of safety. Water is next removed from the surface of silicon dioxide layer 12 by exposing wafer 10 to isopropyl alcohol vapors. These vapors dry the surface of layer 12 without leaving residual moisture on this surface. Growth of silicon layer 13 then follows immediately after this drying step. Alternatively, wafer 10 is pulled directly out of the oxidation furnace and placed immediately in the silicon deposition reactor for the growth of silicon layer 13.

It should be noted that silicon layer 13 is grown on silicon dioxide layer 12 rather than evaporated on this layer. Evaporated silicon has been found to be unsatisfactory for layer 13 because evaporated silicon breaks as it is deposited. Although the nature of these breaks is not understood completely, subsequent etching and diffusing steps enlarge these cracks and cause open circuits in the evaporated silicon, thus rendering devices incorporating evaporated silicon inoperative.

Next, the grown silicon 13 and the exposed surfaces of silicon dioxide layer 12 are masked and selected portions of the silicon and silicon dioxide are etched away to expose portions 14 and 41 (FIG. *4b*) of the underlying silicon substrate 11.

Wafer 10 is next placed in a diffusion furnace and P type impurities, typically boron, are diffused into portion 14 and 41 (FIG. *4b*) of silicon 11 to a concentration of about $10^{17}$ to $10^{19}$ atoms per cubic centimeter. These P type impurities likewise diffuse into the deposited silicon 13. This last diffusion is essential to obtain the highly conductive silicon gate electrode of this invention. FIG. *4b* shows a top view of wafer 10 after this diffusion.

Figure 3A:
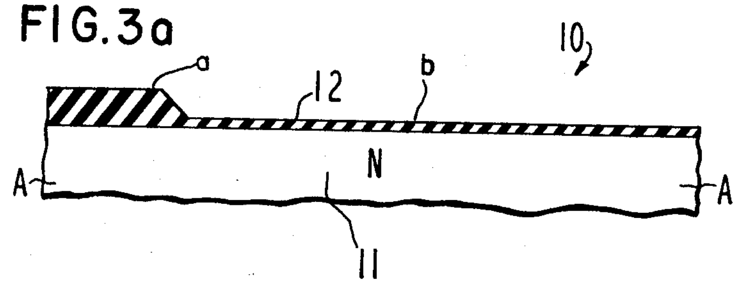
FIGS. 3*a* through 3*e* show in cross-section stages of the construction of an MOS device using a silicon gate electrode selectively doped with P-type impurities.
Figure 3B:
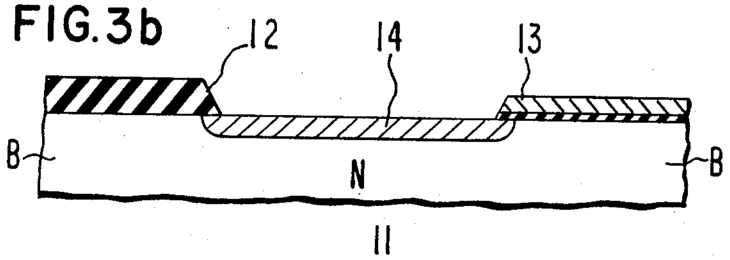
Figure 3C:
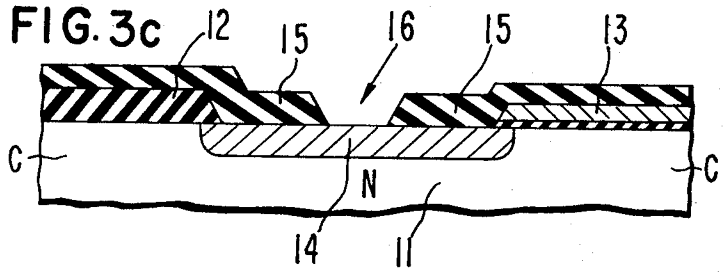
Figure 4C:
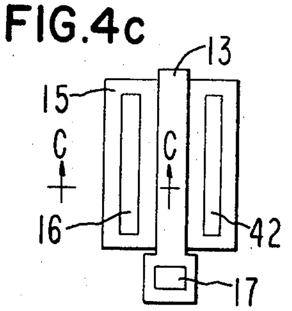
Figure 3D:
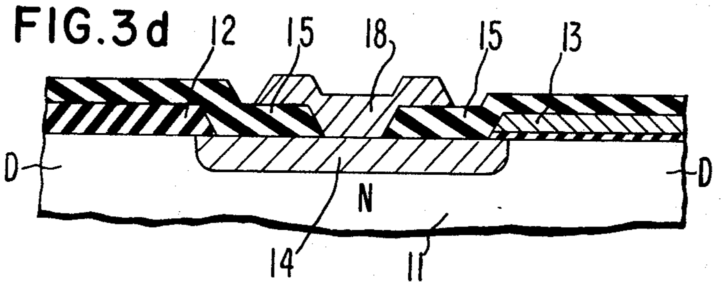

Next, a layer 15 of silicon dioxide is deposited over exposed silicon dioxide layer 12, P+ regions 14 and 41 and silicon layer 13. Layer 15 typically is 0.6 to 0.8 microns thick. Windows 16, 42 and 17 are etched through this deposited silicon dioxide layer 15 to expose portions of P-type regions 14 and 41 as well as a portion of silicon 13. FIG. 4c shows the top view of wafer 10 from which the cross-sectional view "C—C" shown in FIG. 3c is obtained.

After windows 16, 42 and 17 have been etched in layer 15, wafer 10 is masked and aluminum contact 18, shown in FIG. *3d*, is evaporated onto the wafer so as to make contact with the exposed portion of P+ region 14. In addition, aluminum contact 48, shown in FIG. *4d*, is evaporated through window 42 over a corresponding P+ region 41 (shown in FIGS. *4b* and *4d*) to make similar contact with a portion of region 41. And as shown in FIG. *4d*, aluminum 49 is selectively evaporated over silicon dioxide 15 to contact the underlying silicon gate electrode 13 through window 17 cut in layer 15. FIG. *3e* shows in cross-section this aluminum layer 49 contacting silicon electrode 13. A typical thickness for aluminum layers 18, 48 and 49 is 1 to 1½ micron.

Figure 4D:
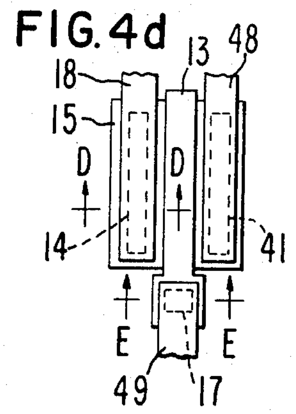
Figure 3E:
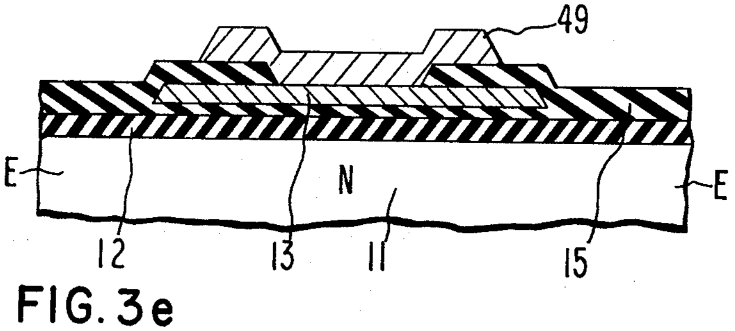

As shown in FIG. 4d, the resulting structure consists of an MOS device with P+ source and drain regions 14 and 41 and with a silicon gate electrode 13 connected by aluminum 49 to a gate voltage source. Because silicon gate electrode 13 is grown prior to the diffusion of the source and drain regions, gate 13 is automatically correctly aligned between the source and drain. And, because of the symmetry of the MOS device, regions 14 and 41 can be used interchangeably as sources or drains, depending on the bias voltage applied thereto. Upon application to the silicon gate electrode of a negative gate voltage slightly larger in an absolute sense than the turn-on voltage (−1.35 volts) of the device, a channel region beneath the gate electrode is depleted of N-type carriers and thereby inverted to P-type material with the result that the region becomes highly conductive. Current then flows from the source to the drain.

Figure 5:
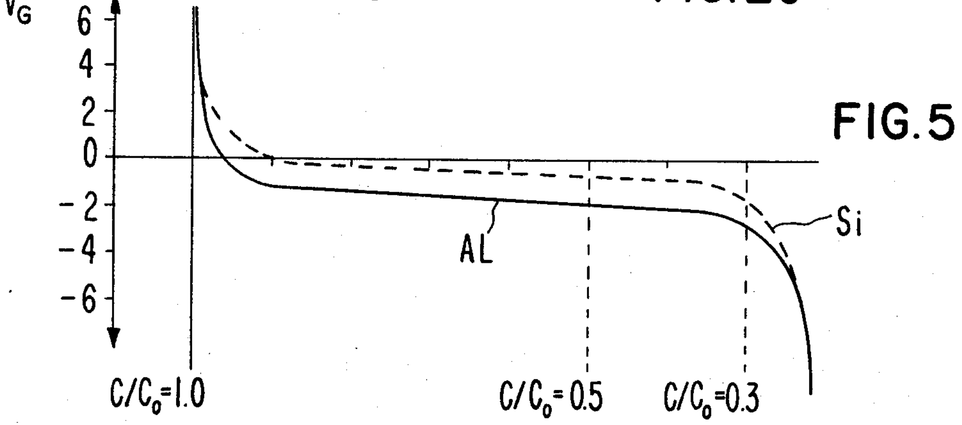
FIG. 5 shows the shift in voltage vs. capacitance curve of an MOS device using a silicon gate electrode.

FIG. 5 shows the shift in the plot of gate voltage $V_g$ versus the capacitance ratio $C/C_o$, for an MOS device using a silicon gate electrode doped with acceptor impurities in a concentration between $10^{17}$ and $10^{19}$ atoms per cubic centimeter. Capacitance $C_o$ is the initial capacitance of the MOS capacitor, which, for a given electrode area, is a function of the thickness and dielectric constant of the intervening dielectric. C is the actual capacitance of the MOS device. FIG. 5 shows that the doped silicon gate electrode decreases the turn-on voltage of the MOS device by about 1.1 volt over the turn-on voltage of the device with an aluminum gate electrode.

FIGS. *7a* through *7e* show one method of constructing an alternative embodiment of this invention using a silicon gate electrode doped with N-type impurities.

In FIG. *7a*, N-type silicon 101 has thermally grown on it silicon dioxide layer 102. Layer 102 is typically 1 micron thick in region *a* and 0.1 micron thick in region *b*. Silicon 101 is of the single crystal type cut in the (111) plane. Single crystal silicon 101 can, if desired, be cut in the (100) orientation. Hereafter, silicon 101, together with any overlying layers of metal and/or insulation, will be called wafer 100.

Figure 7A:
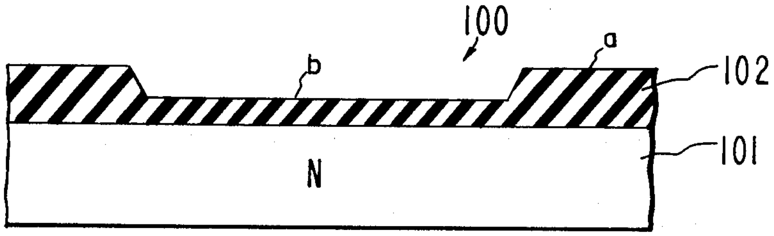
FIGS. 7*a* to 7*e* illustrate one process for making MOS devices with a silicon gate electrode selectively doped with N-type impurities.
Figure 7B:
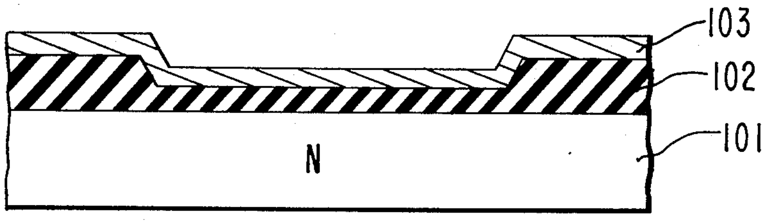
Figure 7C:
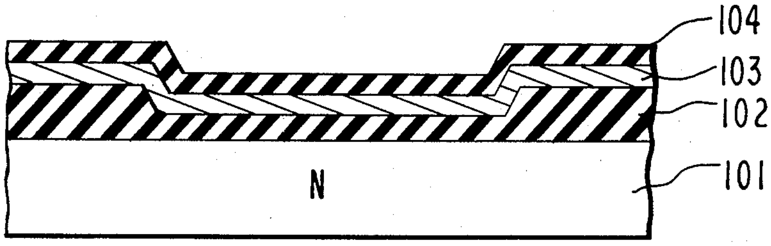

Next, as shown in FIG. *7b*, layer 103 of amorphous silicon is grown over silicon dioxide layer 102 to a thickness of about 0.5 microns. N-type impurities are then diffused into silicon layer 103 to a concentration of about $10^{19}$ atoms per cubic centimeter. There follows, as shown in FIG. 7c, a layer 104 of silicon dioxide deposited over silicon 103.

Figure 7D:
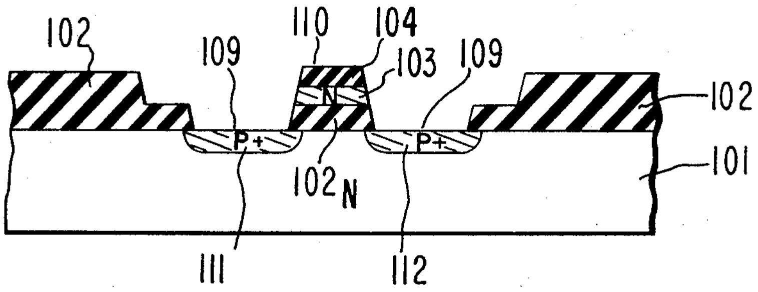
Figure 7E:
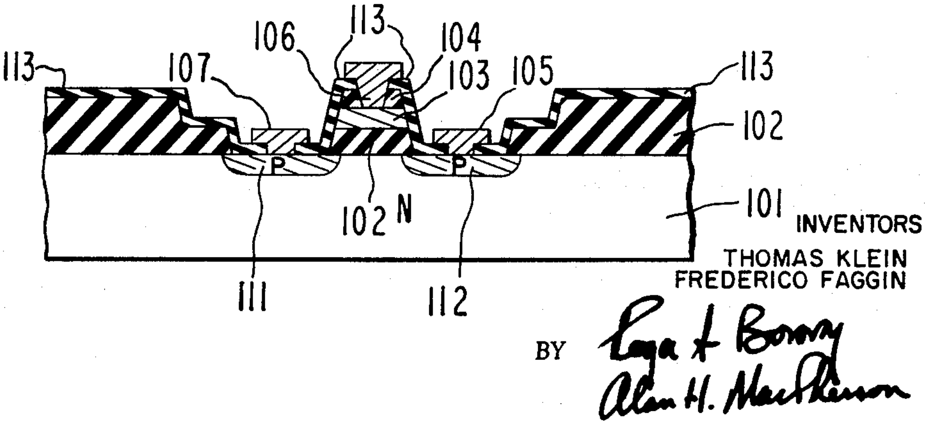

Most of silicon dioxide layer 104 and the underlying silicon 103 are then etched away to leave region 110 consisting of a layer of silicon 103 overlayed by a layer of silicon dioxide 104 (FIG. 7d). Windows 109 are etched through silicon dioxide layer 102 to expose regions of the underlying single crystal silicon 101. P-type dopants are then diffused through these windows to form P-type source and drain regions 111 and 112 in the underlying N-type silicon substrate. Silicon dioxide 104 prevents these P-type dopants from changing the conductivity type of silicon gate 103 from N to P-type.

Next, a thin layer of silicon dioxide 113 is grown over the surface of wafer 100. Windows are then etched through layer 113 to expose surface areas of regions 111, 112 and silicon gate electrode 103. Aluminum electrodes 105, 106 and 107 are finally deposited on the exposed surface areas to provide electrical contact to the source and drain regions of the MOS device and the gate electrode 103.

Figure 8A:
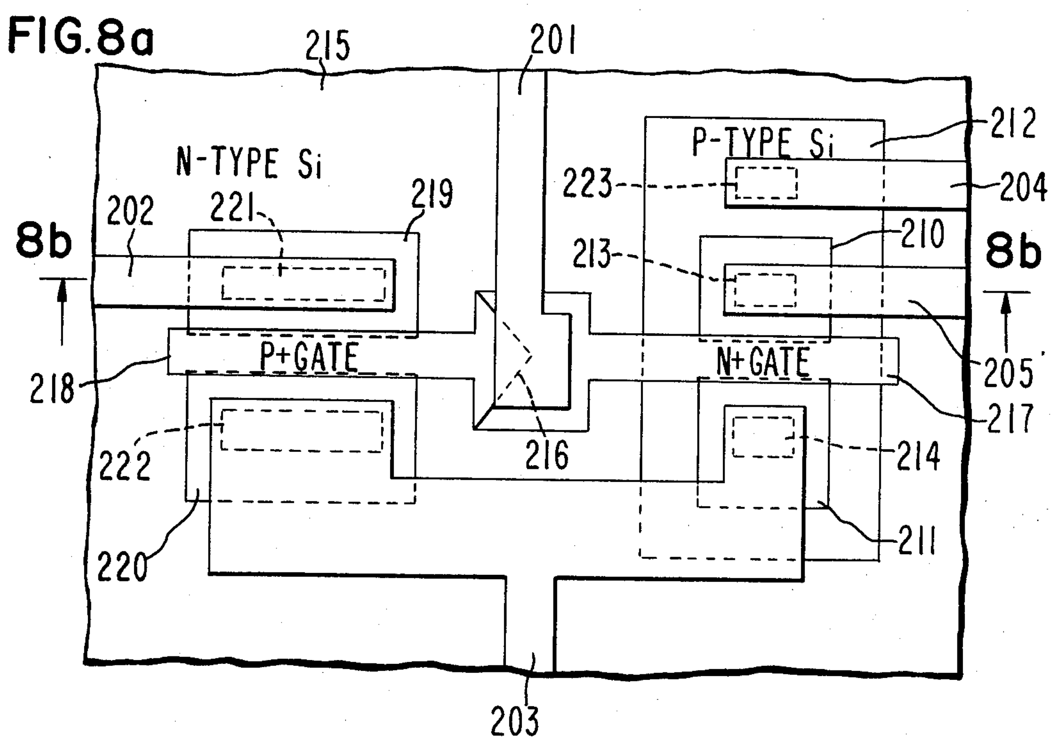
FIGS. 8*a*, 8*b* and 8*c* show, respectively, top and cross-sectional views of an MOS complementary inverter and the schematic diagram of this inverter.
Figure 8B:
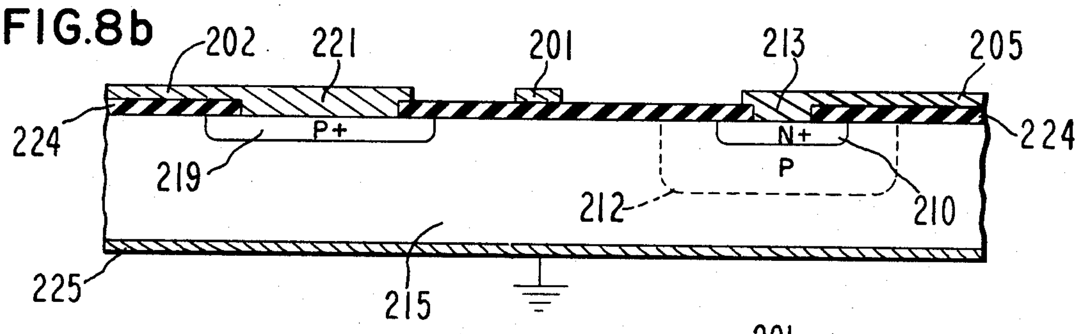

FIG. 8a shows an integrated circuit containing MOS devices using the doped silicon gate electrodes of this invention. Shown in FIG. 8a is the schematic top view of a basic complementary MOS inverter. This inverter contains in its semiconductor substrate both N-type silicon 215 and P-type silicon 212. This substrate is preferably cut in the (100) orientation to minimize $Q_{ss}$. Region 215 has an impurity concentration of about $10^{15}$ atoms per cubic centimeter. Region 212 is formed within region 215 by diffusing P-type impurities into the N-type substrate to a concentration of about $10^{16}$ acceptor atoms per cubic centimeter. N-type source and drain regions 210 and 211 are diffused into P-type region 212 to a concentration of about $10^{19}$ atoms per cubic centimeter. Silicon gate electrode 217 contains N-type impurities likewise diffused to a concentration of about $10^{19}$ atoms per cubic centimeter. Electrode 217 is separated from the underlying P-type silicon substrate by a layer of insulation 224 shown in FIG. 8b.

Contained within the N-type silicon 215 are source and drain regions 219 and 220. Regions 219 and 220 consist of P-type impurities diffused into N-type silicon substrate 215 to a concentration of about $10^{19}$ atoms per cubic centimeter. Overlying the channel region between regions 219 and 220 and separated therefrom by insulation 224 is silicon gate electrode 218. Electrode 218, contrary to electrode 217, is doped with P-type impurities to a concentration of about $10^{19}$ atoms per cubic centimeter. Attached to P-type source and drain regions 219 and 220 through windows 221 and 222 are aluminum electrodes 202 and 203 respectively. Attached to N-type source and drain regions 210 and 211 through windows 213 and 214, are aluminum electrodes 205 and 203, respectively, Thus, region 211 is at the same potential as region 220. P-type silicon substrate 212 is biased to a selected potential by means of aluminum conductor 204 which contacts substrate 212 through window 223 in silicon dioxide layer 224. Aluminum contact 201 is attached to silicon gate electrodes 217 and 218. Line 216 markes the NP junction between gate electrodes 217 and 218.

Figures 8C, 8D, 8E, 8F, 8G:
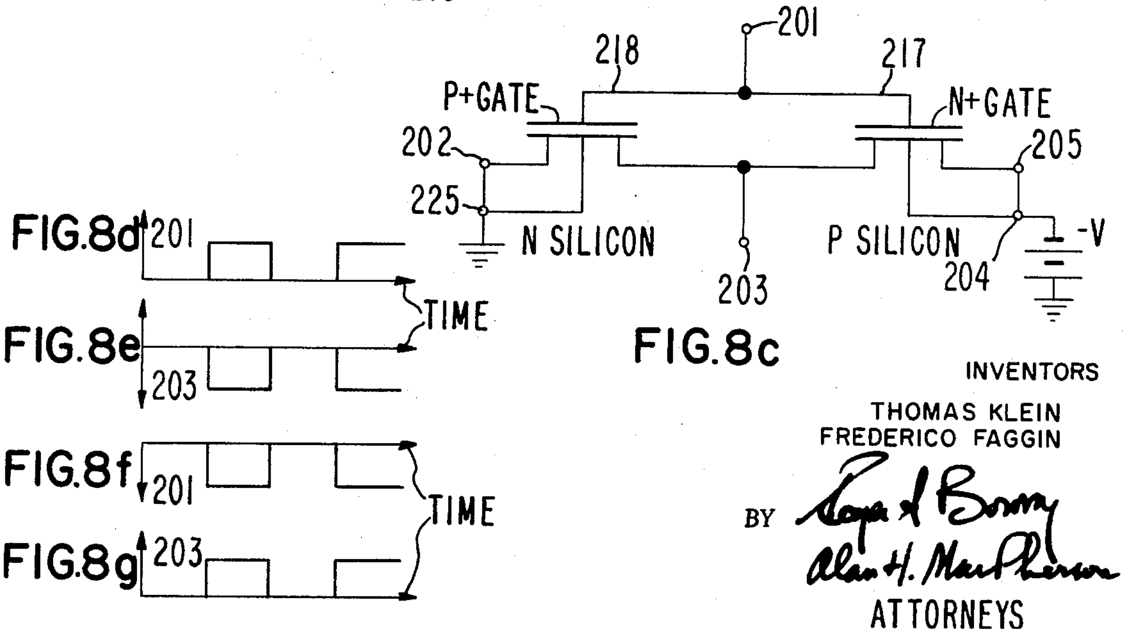
FIGS. 8*d* through 8*g* showed related input and output signals from the inverter of FIGS. 8*a*, 8*b* and 8*c*.

FIG. 8c shows the circuit schematic of the integrated circuit shown in FIG. 8a. For use as an inverter, lead 201 serves as the input lead to the device while lead 203 serves as the output lead from the device. The PN junction between P-type region 212 and N-type region 215 in the silicon substrate is back biased by applying a negative supply voltage through lead 204 to P-type region 212. Lead 225, shown in FIG. 8b attached to the bottom of N-type region 215, is grounded. Lead 202 to P-type region 219 is also electrically grounded. And lead 205 to N-type region 210 (FIG. 8a) is electrically attached to the negative supply voltage.

When an input signal, such as the square wave shown in FIG. 8d, is applied to lead 201, the output signal on lead 203 has the same shape as this input signal, but is inverted in polarity. The two MOS devices shown in FIG. 8c are enhancement mode devices; that is, the channel regions between the source and drain regions of the two devices are normally non-conducting. But when a positive voltage, such as square wave shown in FIG. 8d, is applied to lead 201, the output signal taken from lead 203 resembles the input signal in shape but is of opposite polarity. This occurs because when a positive voltage is supplied to input lead 201, a region just beneath, and including, the surface of region 212 inverts and creates a channel region in which minority carriers predominate between source and drain 211 and 210. The conductivity of this N-type channel is much greater than the conductivity of the P-type silicon. As a result, output lead 203 quickly drops almost to the potential of the negative supply voltage. This drop, which generates the output signal, is shown in FIG. 8e. On the other hand, when the input voltage on lead 201 becomes negative, this voltage has no effect on the depletion channel between source and drain regions 211 and 210 but rather depletes the electrons from the channel region between source and drain 219 and 220. Source 219 is grounded. Upon depletion of these electrons from the channel region, the channel region inverts and becomes P-type, with a conductivity several orders of magnitude higher than possessed by the same channel region with N-type impurities. As a result, the output voltage on lead 203 rises to ground potential. The circuit is thus an inverter.

While this invention has been described with an underlying substrate consisting of single crystal silicon cut in either the (111) or (100) orientation, other single crystal silicon substrates cut in other orientations can also be used in this invention. And while selectively doped amorphous silicon has been described as the gate electrode, selectively doped polysilicon can also be used as the gate electrode. In addition, other semiconductor materials, such as gallium arsenide or gallium phosphide, or combinations thereof, can also be used as gate electrodes. Finally, while an inverter using MOS devices containing silicon gate electrodes doped with both P-type and N-type impurities has been described, other more complicated integrated circuits, using similar gate electrodes, can be built.

We claim:

1. In a self-aligned gate MOS device containing source and drain regions of one conductivity type in a silicon substrate of the opposite conductivity type and with a silicon gate electrode overlying but separated from the channel region between the source and drain regions by an insulating layer of oxide, the improvement which comprises:

the gate electrode being selectively-doped with impurities of the same conductivity type as the substrate and to a level of $10^{17}$–$10^{19}$ atoms/cc and being amorphous semiconductor material grown on said silicon oxide from the thermal decomposition of silane in a hydrogen atmosphere at a temperature between 630° and 680° C.

* * * * *